SHIELDED PRINTED CIRCUIT ELECTRICAL COMPONENT

Filed Dec. 16, 1957 3 Sheets-Sheet 1

Howard W. Wegener
Benjamin M. Mikulis
*INVENTORS*

Howard W. Wegener
Benjamin M. Mikulis
INVENTORS

Howard W. Wegener
Benjamin M. Mikulis
*INVENTORS*

2,963,535
Patented Dec. 6, 1960

2,963,535

SHIELDED PRINTED CIRCUIT ELECTRICAL COMPONENT

Howard W. Wegener and Benjamin M. Mikulis, Nashua, N.H., assignors to Sanders Associates, Inc., Nashua, N.H., a corporation of Delaware Filed Dec. 16, 1957, Ser. No. 703,016
6 Claims. (Cl. 174—36)

The present invention relates to printed circuit type articles, such as flexible cabling utilizing copper conductors bonded to a wide range of plastic materials. More particularly, this invention relates to shielded, flexible printed circuits.

Printed circuit articles have been developed providing, in printed circuit form, the equivalent of the conventional multi-conductor cables. The printed circuit type of cable assumes the form of a flat, relatively thin sheet of plastic material having flat, thin conductors all in the same plane or at most in a few superimposed planes. In one form of such a cable, the conductors are of uniform width and separated by a uniform distance.

The present invention is directed to an improvement in such printed circuits by providing a solution for the problems arising from the necessity for shielding. In the past, electrostatic and electromagnetic shielding of circuits has been accomplished by surrounding the individual conductors with braided copper or laminating the entire circuit between sheets of copper. Neither of these techniques is appropriate for use in a flat flexible printed circuit. The shielded braided cable is uneconomical, susceptible to damage and requires further processing to encapsulate the entire cable. The solid shielding, on the other hand, is not flexible enough.

It is therefore an object of the present invention to provide an improved shielded, printed circuit article.

It is a further object of the present invention to provide an improved shielded, printed circuit having a flat form factor and improved flexibility.

Yet another object of this invention is to provide a shielded, printed circuit having a flat form factor, and improved flexibility with shield characteristics comparable to a solid shield.

In accordance with the present invention, there is provided a flexible, thin, flat, shielded printed circuit electrical component. This article comprises a substantially longitudinal elongated, thin, flat, planar inner signal conductor. There are provided means for electrically shielding the signal conductors substantially along its entire length. The means provided include an outer flexible, substantially planar shield conductor disposed in a plane parallel to the inner conductor. The shield conductor traverses the conductive path of the inner conductor at substantially the entire length of the inner conductor at angles substantially less than 90 degrees thereto. A flexible plastic dielectric is laminated between, intimately bonded to, and reinforced by the outer conductor to form the flexible, thin, flat shielded printed circuit component.

As used herein, the term "plastic" includes a synthetic organic material of high molecular weight, and which, while solid in the finished state, at some stage in its manufacture is soft enough to be formed into shape by some degree of flow. The well-known term "Kel–F" as used herein is the trademark of The M. W. Kellogg Company and refers to the plastic polymer tri-fluoro-chloroethylene as manufactured by them. The well-known term "Teflon" as used herein is the trademark of the E. I. duPont de Nemours & Company, Inc. and refers to the plastic polymer tetra-fluoro-ethylene manufactured by them. The term "ethylene" includes all those plastic materials containing an ethylene radical and the term "vinyl" includes all those plastic materials containing a vinyl radical. The term "Saran," trademark of the Dow Chemical Company, is used herein to denote those plastic materials containing a vinylidine radical. The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
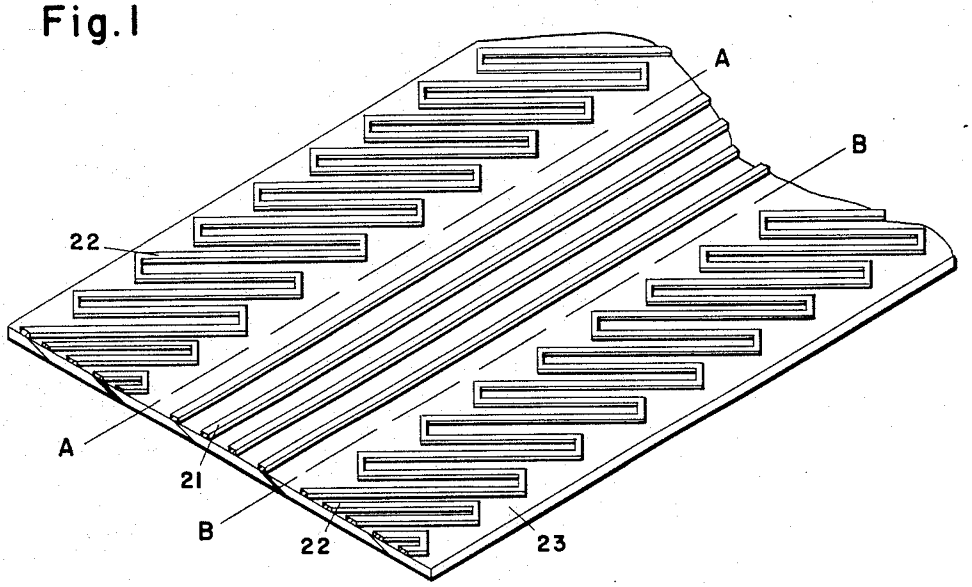
Fig. 1 is a perspective view of the printed circuit article of this invention before lamination.
Figure 2:
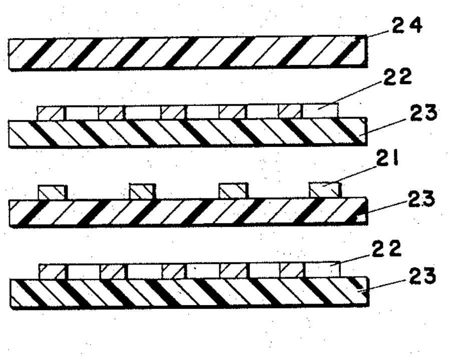
Fig. 2 is an end view in section illustrating the individual laminations of the printed circuit article in Fig. 1.
Figure 4:
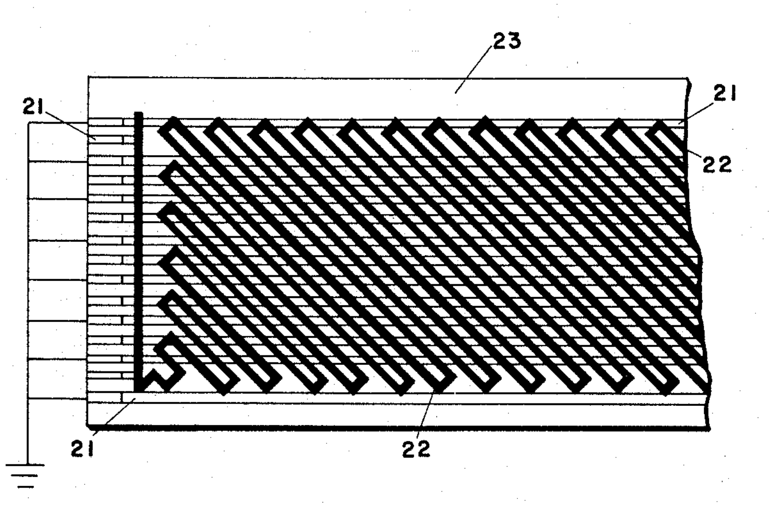
Figure 5:
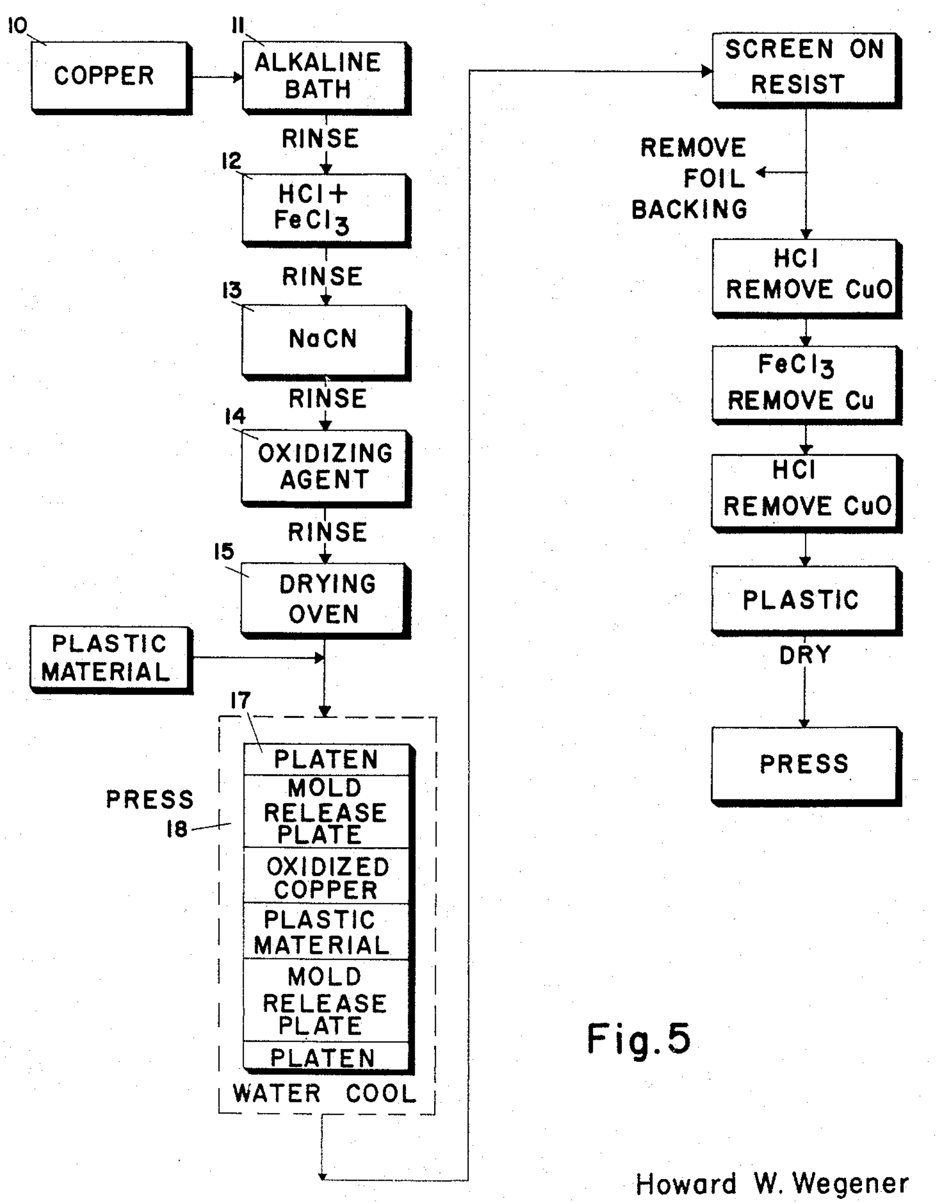

Fg. 3 is a perspective view of the printed circuit article of this invention illustrating the lamination of the shielding to the printed circuit;

Fig. 4 is a plan view of the printed circuit article in Figs. 1 and 2 illustrating another mode of shielding; and Fig. 5 is a flow chart illustrating the preferred process for manufacturing articles in accordance with the present invention.

Referring now to Figs. 1 through 4 of the drawings, there is shown a number of flat, foil-like copper conductors 21 and 22 bonded to a thin flexible plastic base material 23, such as 2 mil Kel–F. The conductors 22 provide means for electrically shielding the conductors 21.

Figure 3:
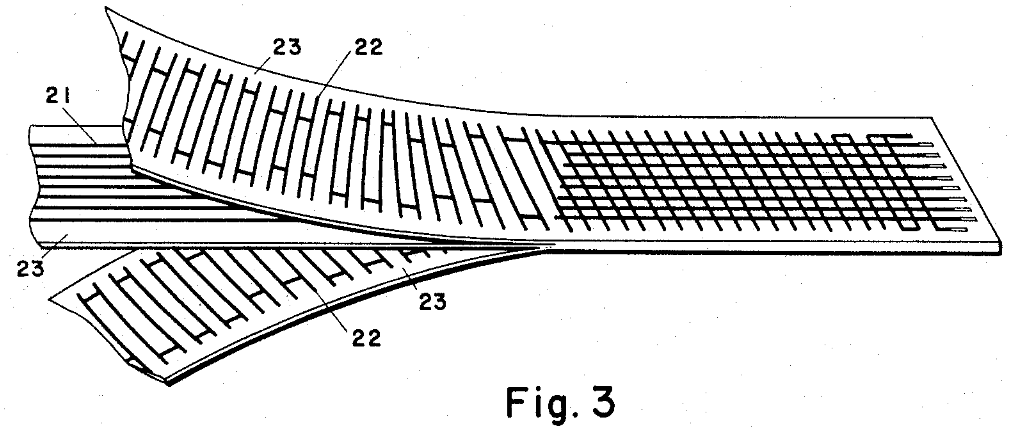

In producing the shielded printed circuit article of this invention, the laminate of Fig. 1 is cut into three strips of equal width by severing the plastic base material 23, along dotted lines A—A and B—B. These strips are then laminated by sandwiching signal energy carrying conductors 21, between the two strips of shield conductors 22, as illustrated in Fig. 3. Each layer of conductors will then be separated by the plastic base material 23, as shown in Fig. 2. In order to protect the one exposed shield conductor 22, an overlay of Kel–F 24 or other suitable plastic dielectric, is placed on top during the final laminating step.

The embodiment of Fig. 4 illustrates a shielded, flat, flexible, laminated printed circuit in which the conductive path of shield conductors 22 traverses the conductive path of signal energy conductors 21 at a plurality of points at an angle of approximately 45°. This shielding arrangement has certain marked advantages, the greatest of which is its resistance to cracking after continuous flexing. In the usual course of handling, the greatest amount of flexing takes place along lines in the plane of but perpendicular to the longitudinal axis of the cable. Cracking of the plastic insulation ordinarily will first occur along these flexure lines. In the embodiment of Fig. 4, however, no conductors are perpendicular to the longitudinal axis of the cable. The conductors in this configuration therefore tend to reinforce the plastic and add to its resistance to cracking without materially lessening its flexibility. As shown in Fig. 4, alternate conductors in the plane of the signal energy carrying conductors may be grounded. This may be carried out in any of the embodiments to provide additional shielding when necessary. These shield conductors in the plane of the signal energy conductors may also be electrically connected to the outer shield conductors by pins or staples (not shown) at various points along the table.

*Tri-fluoro-chloro-ethylene—Copper article*

Referring now to Fig. 5, a flow chart for a method of manufacturing a shielded, printed circuit is illustrated. For a plastic such as tri-fluoro-chloro-ethylene, the method is carried out in detail in the following manner:

Sheets of copper 10 are:

(1) Immersed in a mild alkaline bath 11, such as Dy-Clene EW Metal Cleaner, as manufactured by MacDermid, Inc., of Waterbury, Connecticut, for five seconds;

(2) Rinsed in cold, running water for five seconds;

(3) Dipped for 15 seconds in a 10 percent solution of hydrochloric acid (HCl) 12 containing a small amount of ferric chloride ($FeCl_3$);

(4) Rinsed in cold, running water for five seconds;

(5) Immersed in a 10 percent solution 13 of sodium cyanide (NaCN) for 15 seconds and then rinsed;

(6) Immersed for 10 minutes at 190° F.–210° F. in an oxidizing agent 14, such as an aqueous solution of 1 and ½ pounds of Ebonol "C" Special, as manufactured by Enthone Company, New Haven, Connecticut, per gallon of water. The oxidizing agent is preferably a hot aqueous solution consisting essentially of an alkali selected from the group consisting of sodium hydroxide and potassium hydroxide and a chlorite selected from the group consisting of sodium chlorite and potassium chlorite;

(7) Immersed in cold, running water;

(8) Rinsed in hot, running water for 10 to 20 seconds; and (9) Baked in a preheated oven 15 at a temperature above 212° F. until all traces of moisture are removed.

These steps result in providing a sheet of copper having a cupric oxide surface obtained by utilizing a chemical agent rather than by applying heat as in the prior art. The cupric oxide obtained in the manner described in steps 1 to 9 above is quite different from that obtained by heating. It appears as a homogeneous, velvety black coating. The black is intense. Under a microscope of greater than 300 power, the crystals of oxide appear fine and needle-like and in a much thinner layer than that obtained when copper is heated. Further, and probably most important, this cupric oxide differs from that obtained by heating in that it is tightly bonded to the copper and will not flake off.

The copper sheets obtained by means of steps 1 to 9 above are now ready for lamination to a plastic. The lamination process is, for example, as follows:

(10) Place a sheet of thin, metallic-foil mold release plate, such as aluminum, on the platen of a press 18, such as manufactured by Wabash Press Company, Wabash, Indiana; the aluminum foil is used to prevent adherences between the tri-fluoro-chloro-ethylene and the platen;

(11) Place a lamination of a sheet of plastic material on the platen 17 of the press 18. This lamination may have as many layers as desired, for reasons to be considered more fully hereinafter. The plastic may be, for example, tri-fluoro-chloro-ethylene and each sheet may be, for example, 6 inches long, 2 inches wide and 2 mils thick. The temperature of the oven is, for example, 400° C.;

(12) Place a sheet of copper, coated in accordance with steps 1 to 9 on top of a tri-fluoro-chloro-ethylene layer of the laminate and apply an initial pressure of approximately 5 pounds per square inch, gradually increasing the presure;

(13) Bake under pressure at 216° C. to 219° C. for 40 seconds;

(14) Remove the copper clad plastic from the press and quench in cold water; and

(15) Remove the aluminum foil.

This process removes a copper-clad plastic article which may be used for any of a number of purposes. Though definite pressures and temperatures are mentioned above, the pressures, times and temperatures are interrelated and vary also with the thickness, area and type of plastic material used. Generally, the temperature is in the range of 215° C. to 300° C., the initial pressure being of the order of 5 pounds per square inch but building up to higher pressures which may be of the order of hundreds of pounds per square inch. The parameters are time-temperature, primarily and, to some degree, time and temperature, in terms of the pressure applied, may be interchanged.

The plastic can, of course, be copper clad on both sides merely by placing sheets of copper both above and below the plastic. Similarly, a number of sheets of plastic may be intermixed with cupric oxide coated sheets of copper to form a laminated structure.

Another method for effecting the bond involves the use of a rotary press. The rollers are heated to a temperature of 215° C. to 250° C. and thermostatically maintained. The copper-plastic bond is effected by covering a sheet of plastic, such as tri-fluoro-chloro-ethylene and with two sheets of cupric oxide coated copper and introducing the composite article between the rollers. Preferably, the rollers are spaced so as to apply a positive pressure greater than 5 pounds per square inch, and are rotated at such a rate as to provide a linear speed of, for example, 10 inches per minute, to the sheets.

A modified form of the improved method of bonding tri-fluoro-chloro-ethylene to copper involves the use of powdered tri-fluoro-chloro-ethylene which is spread on top of a sheet of cupric oxide covered copper. For unplasticized powder of high molecular weight, the operating temperature range may be as high as 300° C. After placing the powder in contact with the copper (and, if desired, applying another sheet of copper on top of the powder), the press is closed at the rate of 0.2 inch per minute until the desired thickness is obtained as determined by gauge blocks. By shining a light through the material, a color change will be observed from pink to white. After the white light appears, the press is held in place for 15 to 30 seconds, depending upon the thickness of the material desired. The composite sheet thus obtained is then quenched in cold water or transferred to a cold press. In both processes immediate quenching produces crystallization and thus a relatively high degree of transparency. The other layers of plastic can be added as desired.

The bond strengths obtained as measured by delaminating a one inch strip of copper from the tri-fluoro-chloro-ethylene are consistently greater than 8 pounds per inch. Bond strengths of 18 pounds per inch and higher are obtainable. For example, laminates prepared by starting with the tri-fluoro-chloro-ethylene powder as indicated above are characterized by bond strengths which are consistently in excess of 15 pounds per inch.

To manufacture a component of an electric circuit, the copper of the article prepared in the manner described above may be treated as indicated in the remainder of the flow chart of Fig. 1. A resist is placed on the copper in the pattern of a desired configuration and the excess removed by a suitable etching technique. The remaining resist is removed and the circuit may then be encapsulated by placing a sheet of plastic in contact with the coated copper and sealing by means of pressure in the manner described above.

*Tetra-fluoro-ethylene—Copper article*

Using the same apparatus and general procedure as outlined in Fig. 1, and differing only in the plastic to copper bonding process, a thin sheet of Teflon, for example under .010 inch thick, is placed in contact with a sheet of cupric oxide coated copper foil, for example 2 ounce copper, and placed in the press 18. The plastic-copper laminate is preheated at approximately 700° F. for several minutes and then pressed at that temperature and in the order of 250 pounds per square inch pressure for about 6 minutes. The laminate is then water cooled in the press under continued pressure. Bond strengths have been observed as high as 8 pounds per inch.

A number of compounds which typify large classes of plastic materials have been laminated to cupric oxide coated copper in the manner suggested above. The temperature, pressure, preheat time under slight pressure, heating time under pressure, the thickness of copper used, the thickness of the plastic and the resultant peel strengths are tabulated below for a number of materials utilized.

PARAMETERS FOR BONDING COPPER TO PLASTIC

| | Temp. of Materials (° C.) | Pressure (Lbs./In.) | Time of Preheat (Minutes) | Minimum Time in Press (Minutes) | Thickness of Copper ($10^{-3}$ In.) | Thickness of Plastic ($10^{-3}$ In.) | Peel Strength (Grams/In.) |
|---|---|---|---|---|---|---|---|
| Ethylenes: | | | | | | | |
| Polyethylene | 127 | 70–80 | 1 | 4 | 1.35 | ---------- | [2] >3,000 |
| Kel-F | 234 | 120–150 | 5 | 6 | 1.35 | 10 | 4,200 |
| Teflon [1] | 380 | 120–150 | 5 | 6 | 2.70 | 10 | 1,650 |
| Vinyls: | | | | | | | |
| Polyvinyl Chloride | 220 | 120–150 | 1 | 4 | 1.35 | 10 | 3,100 |
| Polyvinyl Butyral | 193 | 120–150 | 1 | 4 | 2.70 | 8.5 | 3,300 |
| Polyvinyl Acetate | 200 | 120–150 | 1 | 4 | 2.70 | 10 | 3,100 |
| Polyvinyl Alcohol [1] | 205 | 325–350 | 1 | 4 | 2.70 | 11 | 5,500 |
| Saran: | | | | | | | |
| Polyvinylidene Chloride | 180 | 120–150 | 1 | 4 | 2.70 | 12 | ([3]) |
| Polyvinylidene Styrene | 205 | 120–150 | 5 | 6 | 2.70 | 31 | 2,500 |
| Polyamides: | | | | | | | |
| Nylon NC-10 [1] | 250 | 325–350 | 5 | 6 | 1.35 | Crystals | 4,000 |
| Cellulosics: | | | | | | | |
| Cellulose Acetate [1] | 193 | 120–150 | 1 | 4 | 2.70 | 30 | 7,260 |
| Acrylics: | | | | | | | |
| Methyl Methacrylate [1] (Plexiglas) | 250 | 325–350 | 5 | 6 | 2.70 | 66 | 2,000 |
| Rubber Hydroxide [1] | 122 | 120–150 | 1 | 4 | 1.35 | 9 | Decomposes |

[1] Press—water cooled.
[2] Tearing of polyethylene.
[3] Turned brown—tearing of material at 1500 grams.

The plastic-copper bonding mechanism is not thoroughly understood. However, as a result of much experimentation and analysis, it is believed that the bonding mechanism is essentially mechanical. One basic requirement seems to be that the plastic material must flow fairly readily without decomposing. As indicated in the previous table, some of the materials tend to decompose before the desired melt-viscosity is reached even through a satisfactory bond may still be obtained. In the case of some forms of Teflon the degree of plasticity increases with temperature, but the material tends to decompose or sublimate before it reaches a suitable flow point. It will be apparent, however, that while a degree of flow is necessary to cause the plastic material to fill the interstices formed by cupric oxide needles, more or less randomly oriented, a good bond is obtainable even through ideal flow conditions are not realized. In the case of the polyvinyl material it has been frequently observed that the bond is stronger than the plastic material itself. Thus, for polyvinyl chloride and polyvinyl acetate the peel strength is indicated on the order of 3000 grams. This is the pulling force at which the plastic material broke.

The present invention presents an important step forward in the art of printed circuitry, in that the dielectric and flexibility properties of plastic materials may be successfully utilized.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A flexible, thin, flat, shielded printed circuit electrical component, comprising: a substantially longitudinal elongated, thin, flat, planar inner signal conductor; means for electrically shielding said signal conductor substantially along its entire length including a first outer, flexible, substantially planar shield conductor and a second outer, flexible substantially planar shield conductor, said outer conductors being disposed in planes parallel to said inner conductor on opposite sides thereof and traversing the conductive path of said inner conductor at substantially closely spaced points throughout substantially the entire length thereof at angles substantially less than 90° thereto; and a flexible plastic dielectric laminated between, intimately bonded to and reinforced by said inner and outer conductors to form said flexible, thin, flat, shielded printed circuit component.

2. A flexible, thin, flat, shielded printed circuit electrical component, comprising: a plurality of substantially longitudinal elongated, thin, flat, planar inner signal conductors; means for electrically shielding said signal conductors substantially along its entire length including a first outer, flexible, substantially planar shield conductor and a second outer, flexible, substantially planar shield conductor, said outer conductors being disposed in planes parallel to said inner conductors on opposite sides thereof and traversing the conductive path of said inner conductors at substantially closely spaced points throughout substantially the entire length thereof at angles substantially less than 90° thereto; and a flexible plastic dielectric laminated between, intimately bonded to and reinforced by said inner and outer conductors to form said flexible, thin, flat, shielded printed circuit component.

3. A flexible, thin, flat, shielded printed circuit electrical component, comprising: a substantially longitudinal elongated, thin, flat, planar inner signal conductor; means for electrically shielding said signal conductor substantially along its entire length including a first outer, flexible, substantially planar shield conductor and a second outer, flexible substantially planar shield conductor, said outer conductors being disposed in planes parallel to said inner conductor on opposite sides thereof and traversing the conductive path of said inner conductor at substantially closely spaced points throughout substantially the entire length thereof at an angle of forty-five degrees thereto; and a flexible plastic dielectric laminated between, intimately bonded to and reinforced by said inner and outer conductors to form said flexible, thin, flat, shielded printed circuit component.

4. A flexible, thin, flat, shielded printed circuit electrical component comprising: a substantially longitudinal elongated thin, flat, planar inner signal conductor; means for electrically shielding said signal conductor substantially along its entire length including a planar shield conductor adjacent to and in the plane of said signal conductor, and first outer, flexible substantially planar shield conductor and a second outer, flexible substantially planar shield conductor, said outer conductors being disposed in planes parallel to said inner conductor on opposite sides thereof and traversing the conductive path of said inner conductor at substantially closely spaced points throughout substantially the entire length thereof at angles substantially less than ninety degrees thereto; and a flexible plastic dielectric laminated between, intimately bonded to and reinforced by said inner and outer conductors to form said flexible, thin, flat, shielded printed circuit component.

5. A flexible, thin, flat, shielded printed circuit electrical component, comprising: a substantially longitudinal elongated, thin, flat, planar inner signal conductor; means for electrically shielding said signal conductor substantially along its entire length including a first outer, flexible, substantially planar shield conductor and a second outer, flexible substantially planar shield conductor traversing the conductive path of said first outer conductor at an angle of substantially ninety degrees, said outer conductors being disposed in planes parallel to said inner conductor on opposite sides thereof and traversing the conductive path of said inner conductor at substantially closely spaced points throughout substantially the entire length thereof at an angle of substantially forty-five degrees thereto; and a flexible plastic dielectric laminated between, intimately bonded to and reinforced by said inner and outer conductors to form said flexible, thin, flat shielded printed circuit component.

6. A flexible, thin, flat, shielded printed circuit electrical component comprising: a substantially longitudinal elongated, thin, flat, planar inner signal conductor; means for electrically shielding said signal conductor substantially along its entire length including an outer, flexible, substantially planar shield conductor disposed in a plane parallel to said inner conductor and traversing the conductive path of said inner conductor at substantially closely spaced points throughout substantially the entire length thereof at angles substantially less than ninety degrees thereto; and a flexible plastic dielectric laminated between, intimately bonded to and reinforced by said outer conductor to form said flexible, thin, flat, shielded printed circuit component.

References Cited in the file of this patent

UNITED STATES PATENTS

| | | |
|---|---|---|
| 2,386,753 | Shield | Oct. 16, 1945 |
| 2,586,854 | Myers | Feb. 26, 1952 |
| 2,816,273 | Peck | Dec. 10, 1957 |
| 2,834,828 | Ebel | May 13, 1958 |

FOREIGN PATENTS

| | | |
|---|---|---|
| 976,702 | France | Nov. 1, 1950 |

OTHER REFERENCES

IRE Transactions, vol. MTT-3, March 1955, Number 2, copyright 1955, the Institute of Radio Engineers, Inc., page 38.